(12) United States Patent
Cobos Marquez et al.

(10) Patent No.: US 12,362,093 B2
(45) Date of Patent: Jul. 15, 2025

(54) ELECTRICAL POWER CONVERTER WITH SEGMENTED WINDINGS

(71) Applicant: Differential Power, S.L., Madrid (ES)

(72) Inventors: Jose Antonio Cobos Marquez, Madrid (ES); Alvaro Cobos Figueroa, Madrid (ES)

(73) Assignee: DIFFERENTIAL POWER, SL, Madrid (ES)

( * ) Notice: Subject to any disclaimer, the term of this patent is extended or adjusted under 35 U.S.C. 154(b) by 673 days.

(21) Appl. No.: 17/779,600

(22) PCT Filed: Nov. 27, 2020

(86) PCT No.: PCT/EP2020/083639
§ 371 (c)(1),
(2) Date: May 25, 2022

(87) PCT Pub. No.: WO2021/105369
PCT Pub. Date: Jun. 3, 2021

(65) Prior Publication Data
US 2023/0017789 A1     Jan. 19, 2023

(30) Foreign Application Priority Data

Nov. 27, 2019    (EP) .................................... 19383051

(51) Int. Cl.
*H01F 27/40*      (2006.01)
*H01F 27/29*      (2006.01)
*H01F 27/30*      (2006.01)

(52) U.S. Cl.
CPC ............. *H01F 27/40* (2013.01); *H01F 27/29* (2013.01); *H01F 27/306* (2013.01)

(58) Field of Classification Search
CPC ........ H01F 27/40; H01F 27/29; H01F 27/306; H01F 2027/2814
See application file for complete search history.

(56) References Cited

U.S. PATENT DOCUMENTS

| | | | |
|---|---|---|---|
| 9,379,629 B2 * | 6/2016 | Chandrasekaran | ..... H01F 27/28 |
| 2015/0256087 A1 | 9/2015 | Jitaru | |

(Continued)

FOREIGN PATENT DOCUMENTS

EP     1536435     6/2005

OTHER PUBLICATIONS

European Patent Office; International Search Report and Written Opinion for PCT/EP2020/083639; Feb. 22, 2021; entire document.

(Continued)

*Primary Examiner* — Adolf D Berhane
*Assistant Examiner* — Afework S Demisse
(74) *Attorney, Agent, or Firm* — Sheridan Ross P.C.

(57) ABSTRACT

An electrical power converter with segmented windings is provided. Comprises a transformer or autotransformer including a magnetic core (3) and at least a primary winding (51) and at least a secondary winding (52) arranged around the magnetic core (3). The primary winding and/or the secondary winding have at least one full turn that includes at least one power switch (10) and at least one capacitor (12) connected in series and arranged respectively opposite each other and facing opposite sides of the magnetic core, defining a cell (4) that is divided in four segments, a first segment (23) including said at least one switch, a second opposite segment (24) including said at least one capacitor, and two other connecting segments (21, 22) providing electrical connection between the first segment and the second segment, and each of said two other connecting segments having opposite electrical polarity.

16 Claims, 18 Drawing Sheets

(56) References Cited

U.S. PATENT DOCUMENTS

| | | |
|---|---|---|
| 2018/0027817 A1 | 2/2018 | Lee |
| 2018/0226182 A1 | 8/2018 | Chao |
| 2018/0278174 A1 | 9/2018 | Chen |
| 2018/0323702 A1 | 11/2018 | Zhou |
| 2019/0229633 A1 | 7/2019 | Perreault |
| 2020/0211762 A1* | 7/2020 | Jitaru .................... H02M 3/155 |
| 2020/0350117 A1 | 11/2020 | Nabih |

OTHER PUBLICATIONS

Jitaru; GaN Technology as an enabler for Higher Efficiency Magnetics; Rompower, Tucson, Arizona.

* cited by examiner

ELECTRICAL POWER CONVERTER WITH SEGMENTED WINDINGS

CROSS-REFERENCE TO RELATED APPLICATIONS

This application is the § 371 National Stage Entry of International Application No. PCT/EP2020/083639, filed on Nov. 27, 2020, which claims the benefit of European Patent Application No. 19383051.0, filed on Nov. 27, 2019, the contents of which applications are herein incorporated by reference in their entirety.

TECHNICAL FIELD

The present invention is in the field of electrical power converters including a transformer or autotransformer intended to connect a primary port with a secondary port, the primary port including a DC energy source or an AC energy source and the secondary port including a DC load or an AC load, wherein power may flow bi-directionally just exchanging the energy source and the load.

The invention is based on the integration in at least one turn of a winding wound around a magnetic core of a transformer or autotransformer, at least one switch and at least one capacitor arranged in opposition thereby dividing or splitting the at least one turn into four differentiated segments, i.e. providing a segmented winding.

Loads are further integrated, housed within the magnetic core being surrounded by a segmented winding having at opposite sides at least a switch and at least one capacitor.

In this invention the term "cell" is used to refer to a complete/full turn of a winding/coil of a transformer or autotransformer that includes embedded at least one power switch and at least one capacitor connected in series and arranged respectively opposite each other and facing opposite sides of a magnetic core. The winding can be either a primary or a secondary winding. In this invention the conductor element can be of any kind of electroconductive material, such a as Cu, Cu alloy, etc.

BACKGROUND OF THE INVENTION

EP 1536435 A1 discloses a circuit board with apertures. Separate magnetic flux paths each form a closed loop that passes through at least one of the apertures and surrounds an interior space. The flux paths comprising portions that lie within magnetically permeable core pieces. At least two of the flux paths are oriented so that there is a straight line in the circuit board that passes through the interior spaces of the two flux paths without passing through any of the apertures that are included in the paths. An electrically conductive primary winding having a first segment that passes through the interior spaces of the permeable paths and a second segment located outside of the interior spaces. There are two or more electrically conductive secondary windings.

Ionel Dan Jitaru, of the firm Rompower Energy Systems Inc., discloses in a technical paper "GaN Technology as an enabler for Higher Efficiency Magnetics" several switching topologies and indicates on page 9 referring to leakage inductance in a transformer that "in some applications additional inductive elements are placed in series with the primary winding to add to the leakage inductance", but does not provide any hint about including a switch or a capacitor within a turn of a primary or secondary winding.

US20200350117A1 refers to a transformer, comprising a magnetic core including a plurality of core legs and a leakage core leg, the leakage core leg being positioned among the plurality of core legs to control a leakage inductance of the transformer; and a planar winding structure comprising a primary winding and a plurality of secondary windings, the primary winding and the plurality of secondary windings extending in a number of turns around the plurality of core legs, without a turn around the leakage core leg, to further control the leakage inductance of a matrix transformer. In the example of FIG. 2 the matrix transformer that can be integrated into a single magnetic core includes elemental transformers wherein each of the windings on the secondary side include a series-connected Synchronous Rectifier, and capacitor.

US20150256087A1 discloses a soft switching converter with dual transformers and at least two primary switching devices and at least two synchronous rectifiers in the secondary wherein each of the primary switching device is off when a correspondent synchronous rectifier is on. The use of a large leakage inductance in zero voltage switching of prior art topologies is avoided having soft switching in primary and secondary as well which will turn off the rectifier means at zero current and to turn on primary switches at zero voltage without any additional magnetic elements. The secondary winding of either transformer arranged around a magnetic core includes switches and capacitors connected in series (see FIG. 3B).

US 201827817A1 divulges a power conversion apparatus comprising a first primary circuit having a first primary winding, a second primary circuit having a second primary winding, an inductor having an inductor winding coupled in series with the first and second primary windings, a first secondary circuit corresponding to the first primary circuit, and having first and second secondary windings coupled in series; a second secondary circuit corresponding to the second primary circuit and having third and fourth secondary windings coupled in series and a magnetic core structure. Secondary windings (see FIG. 2) arranged around a magnetic core and comprising one turn flat conductor winding (see FIG. 11) includes switches (that can be for example transistors) operated according to corresponding switching control signals as well as output capacitors (see FIG. 11) connected in series splitting a turn in at least two segments.

BRIEF DESCRIPTION OF THE INVENTION

This invention proposes the segmentation of a winding surrounding a magnetic core, the winding being part of a transformer or autotransformer of an electrical power converter and the winding comprising at least one full turn defining a cell, wherein the at least one cell includes embedded at least one switch and at least one capacitor connected in series and arranged respectively opposite each other and facing opposite sides of the magnetic core. In this way the cell is divided in four segments, two of them arranged respectively opposite each other integrating said at least one switch and said at least one capacitor embedded and the other two segments having opposite electrical polarity and acting as electrical connecting elements of said segments with embedded components.

Such an arrangement in a cell having on opposite sides respectively one or more switches and one or more capacitors connected in series and with two connecting segments facing each other with opposite electrical polarity surrounding a magnetic core, allow:

to insert a load in an aperture of a magnetic core surrounded by at least one cell and feeding this load from the segments of opposite polarity of this at least on cell;

generate compact 2D or 3D spatial structures including a plurality of interconnected cells;

generate compact 2D or 3D spatical structures including a plurality of interconnected cells where at least some of the cells share magnetic paths or share a primary winding that energizes the cells.

A winding as per this invention can comprise several cells, each cell including at least one switch and at least one a capacitor and in addition the cells are connected in parallel, whereby the current capability of the electrical power converter can be regulated, i.e., is adjustable.

In a particular preferred embodiment, an electrical power converter comprises a magnetic core grid in association with a plurality of interconnected cells wherein different cells embrace different magnetic paths. The magnetic core grid includes a plurality of apertures having some of them capacitors that pertain to one of the interconnected cells, and the capacitors being arranged on the sides of the apertures (an aperture can contain one or more capacitors) and these apertures with capacitor/s further houses a load. The magnetic core grid further includes in other adjacent apertures power switches of said cells with capacitors, arranged on the sides of other adjacent apertures.

The cited load housed in the apertures having at least on capacitor on one of the aperture's sides, receives energy from conductive plates arranged over and under the magnetic grid core. The invention also concerns to several constructive embodiments for at least a part of an electrical power converter. In an exemplary embodiment one segment of said at least one cell including at least one switch is integrated in a first electronic board and the second segment of the cell including at least one capacitor is integrated in a second electronic board and the segments of the cell providing an electrical connection of the cited two segments are arranged at least in part either in any of the electronic boards, or as independent pieces.

Other features of the invention will be described in the following explanation of the invention with reference to specific embodiments.

BRIEF DESCRIPTION OF THE FIGS

FIG. 1 schematically shows a magnetic core with indication of a magnetic flux path, according to the state of the art.

FIG. 2 schematically shows the magnetic core of FIG. 1 with indication of the magnetic flux and several cells (each comprising one full turn), the cells being arranged surrounding the magnetic core, around a portion of the magnetic path.

FIG. 3 illustrates one embodiment with a magnetic core that includes two windings according to the teachings of the present invention, each of the windings including at least one cell with power switches and capacitors arranged in opposition, and two other windings without or devoid of power switches and capacitors. One of the windings including one cell of the invention embraces one of the windings devoid of power switches and capacitors.

FIG. 4 schematically shows an embodiment of an electrical power converter with a planar winding structure, where the windings of for example a transformer are surrounded by an E-type magnetic core. The windings including segments integrating switches are arranged at one side of the magnetic core and the segments including capacitors are arranged at an opposite side of the magnetic core, and connecting segments provide electrical connection between said segments including respectively switches and capacitors.

FIG. 5 schematically shows an embodiment of a cell A composed of four connected segments, with a first lateral segment including at least one switch, a top segment constituted by a conductor element, a second lateral segment, opposite to the first lateral segment, including at least one capacitor and a bottom segment constituted by a conductor element and each of said top and bottom connecting segments with a conductor element having opposite electrical polarity.

FIG. 6 schematically shows another cell embodiment where a second cell embraces both the magnetic path and for example the previous cell A.

FIG. 7 schematically shows another cell embodiment like the cell embodiment of FIG. 5 further including a conductor element that enables connection between adjacent cells, this cell embodiment embracing the conductor element and the magnetic path.

FIG. 8 schematically shows a magnetic core which is surrounded by a winding in the form of a coil, pertaining to a primary winding and several cells connected in parallel by electrical conductor elements and pertaining to a secondary winding of an electrical power converter.

FIG. 9A schematically shows a prior art electrical circuit of a power converter.

FIG. 9B schematically shows how as starting from the circuit on the right of the previous state of the art, the proposal of this invention is reached by dividing the secondary winding of the transformer in two connecting segments and having in the two remaining segments, in opposition, a switch and a capacitor directly facing each other.

FIG. 9C schematically illustrates a cell surrounding a magnetic core associated with a load, and FIG. 9D shows two cells connected in parallel by means of conductive plates, as indicated in previous embodiments.

FIG. 9E shows a cross section of a stack in which the load 41 or multiple loads 41 are supplied from an array or multiple arrays of cells as described in previous embodiments.

FIG. 10 schematically shows an embodiment with only one cell 4, including four connected segments: a first lateral segment including one switch, a connecting segment constituted by a conductor element, a second lateral segment, opposite to the first lateral segment, including one capacitor and a connecting segment constituted by a conductor element and each of said connecting segments having opposite electrical polarity.

FIG. 11 schematically shows an arrangement implementing the principles of this invention forming a spatial structure with multiple switches and capacitors and with the conductor elements implemented in this embodiment by conductive plates at the upper and bottom parts.

FIG. 12 shows in a perspective simplified enlarged view an embodiment like the one disclosed in FIG. 10.

FIG. 13 schematically shows an embodiment using the structure of the embodiment of FIG. 11, with a major number of cells surrounding a magnetic core and the cells being connected by means of conductive plates that have opposite electrical polarity.

Figure 16A:
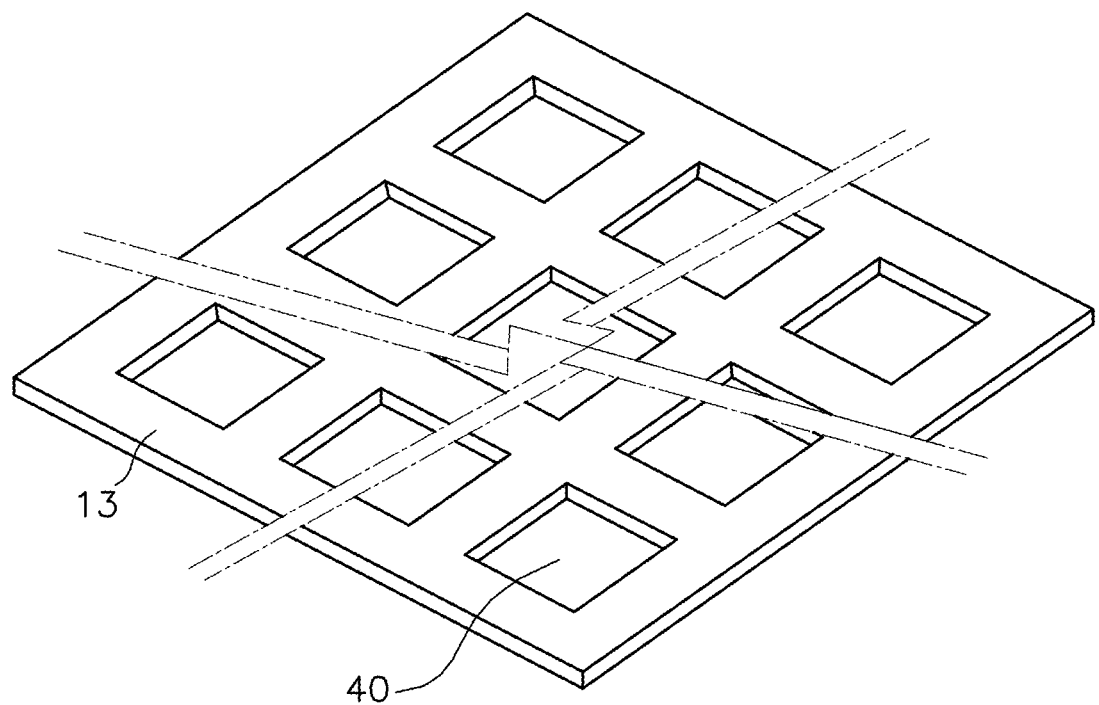
FIG. 16A is a perspective view of a magnetic core in the form of a magnetic core grid.
Figure 16B:
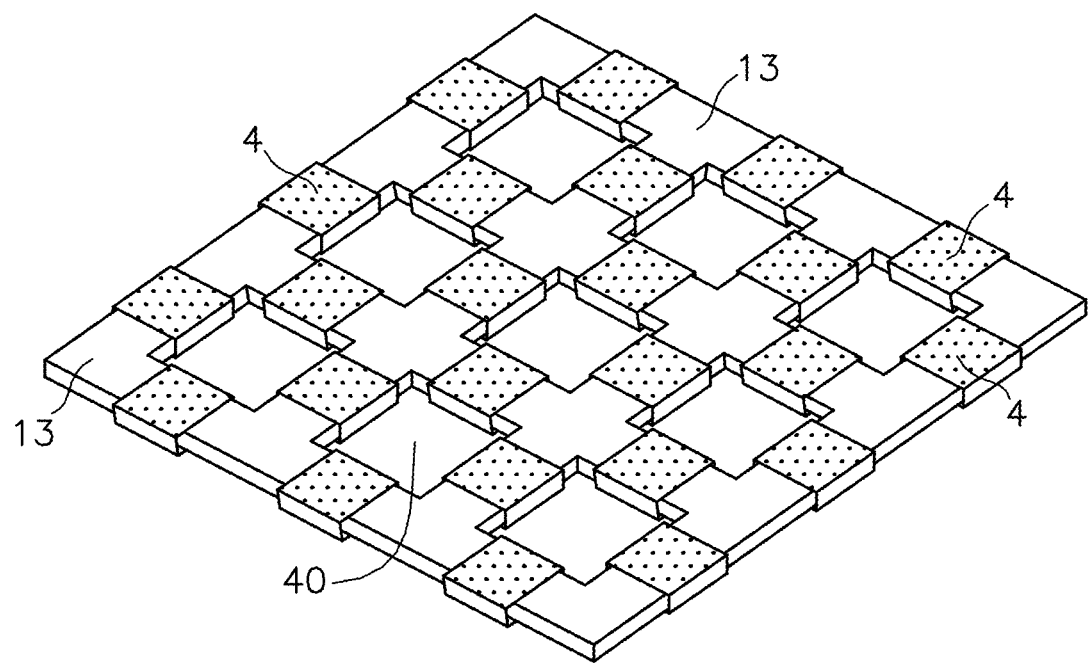
FIG. 16B shows the cited magnetic core grid with several cells surrounding some sides of the apertures of the magnetic core grid and providing at these aperture sides at least a capacitor or at least a switch.
Figure 16C:
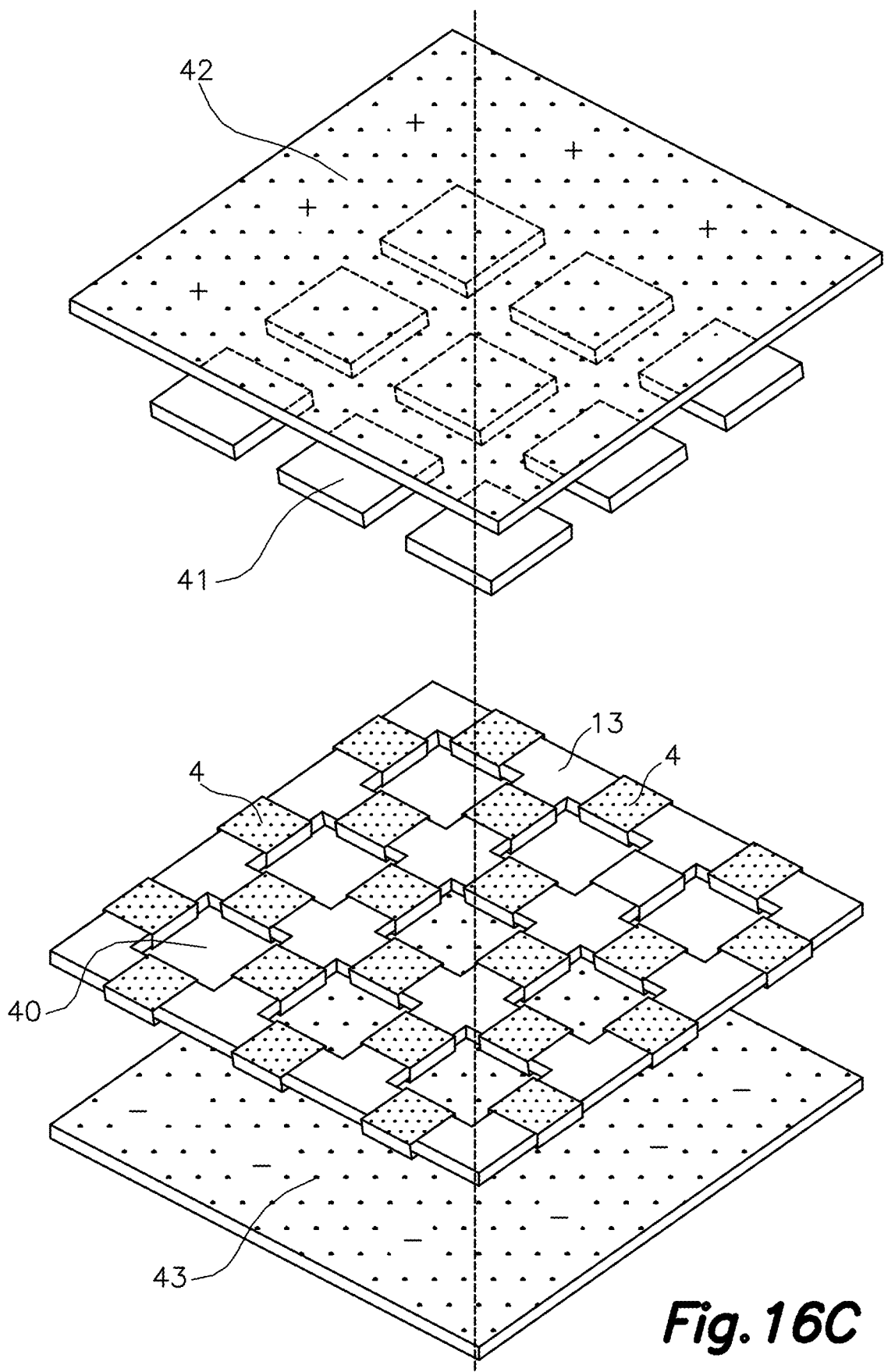

FIG. 16C corresponds to FIG. 16B with indication of several loads that are housed inside some apertures of the magnetic core grid (not all the apertures house a load) and further including at an upper and bottom sides conductive plates to enable an electrical connection between the components (cells and loads).

Figure 16D:
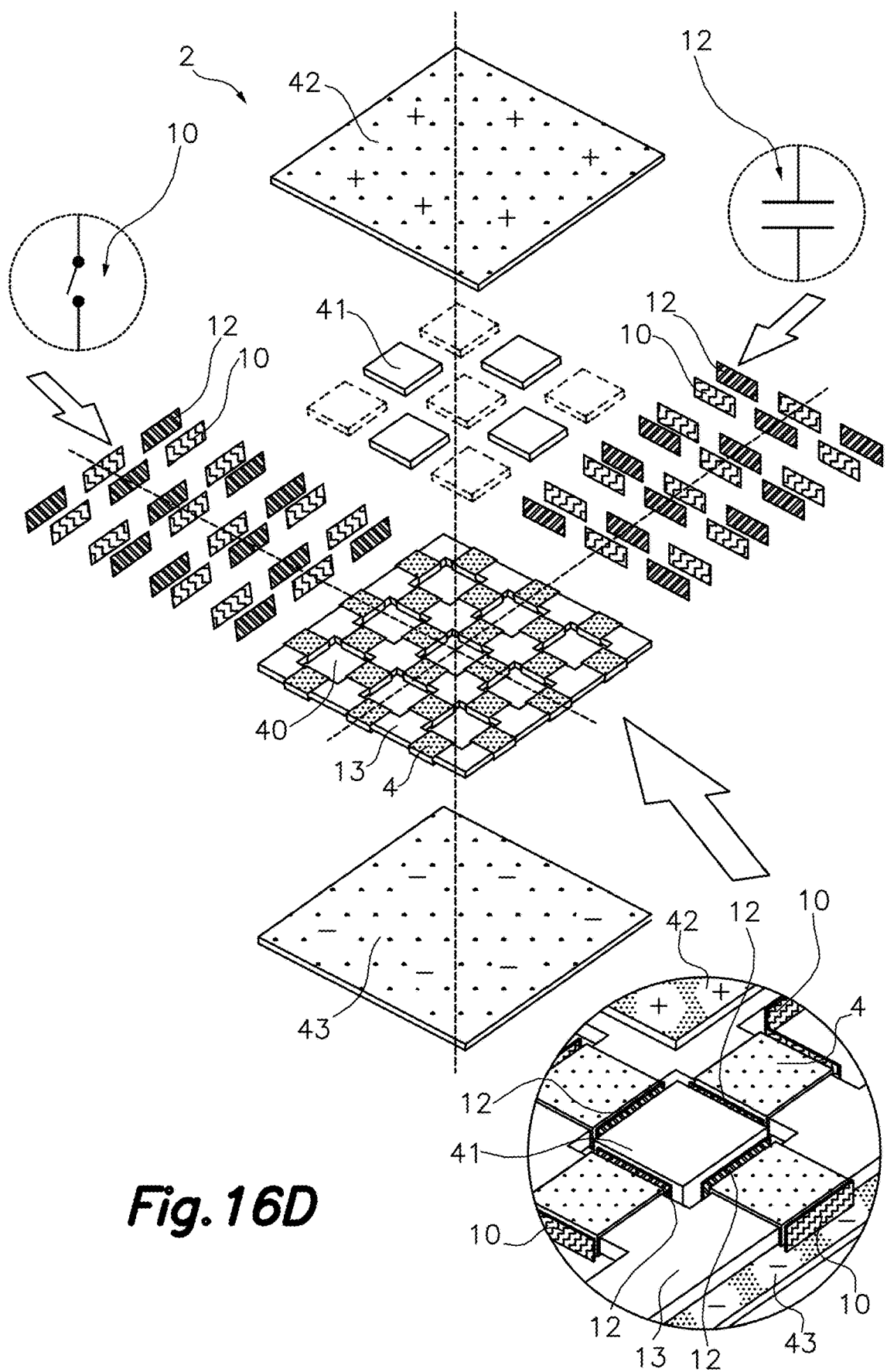

FIG. 16D corresponds to FIG. 16C with the indication of the further arrangement of a plurality of switches and capacitors and with an enlarged portion of the magnetic core grid showing the interrelation between a load, switches and capacitors, the latter surrounding the load.

Figure 17A:
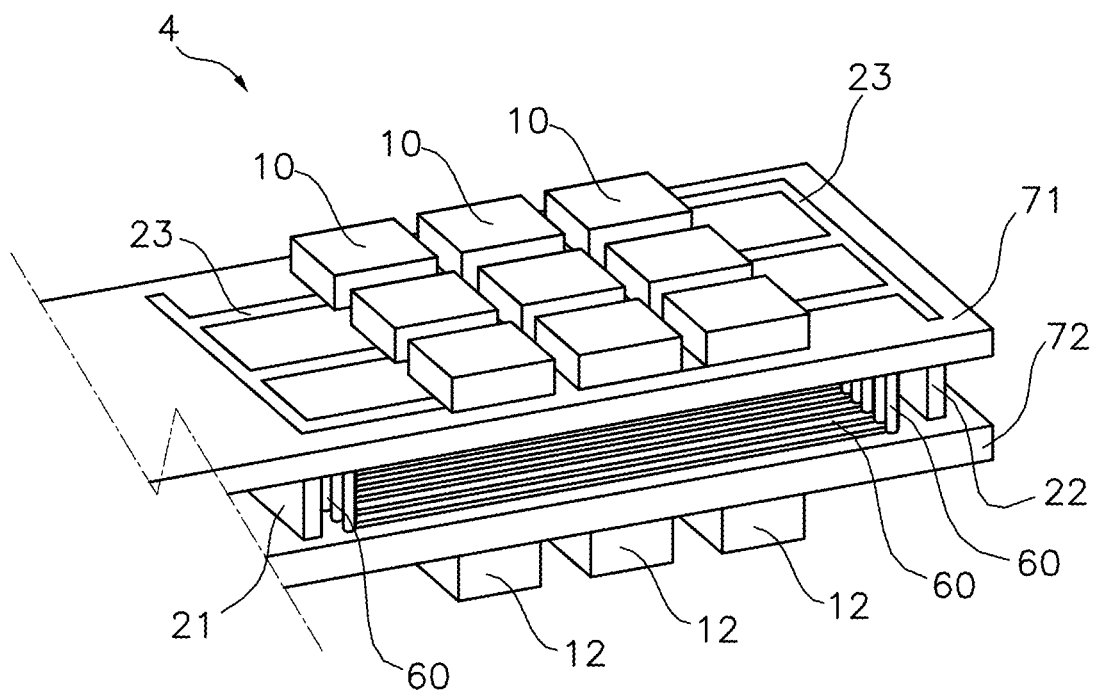
Figure 17B:
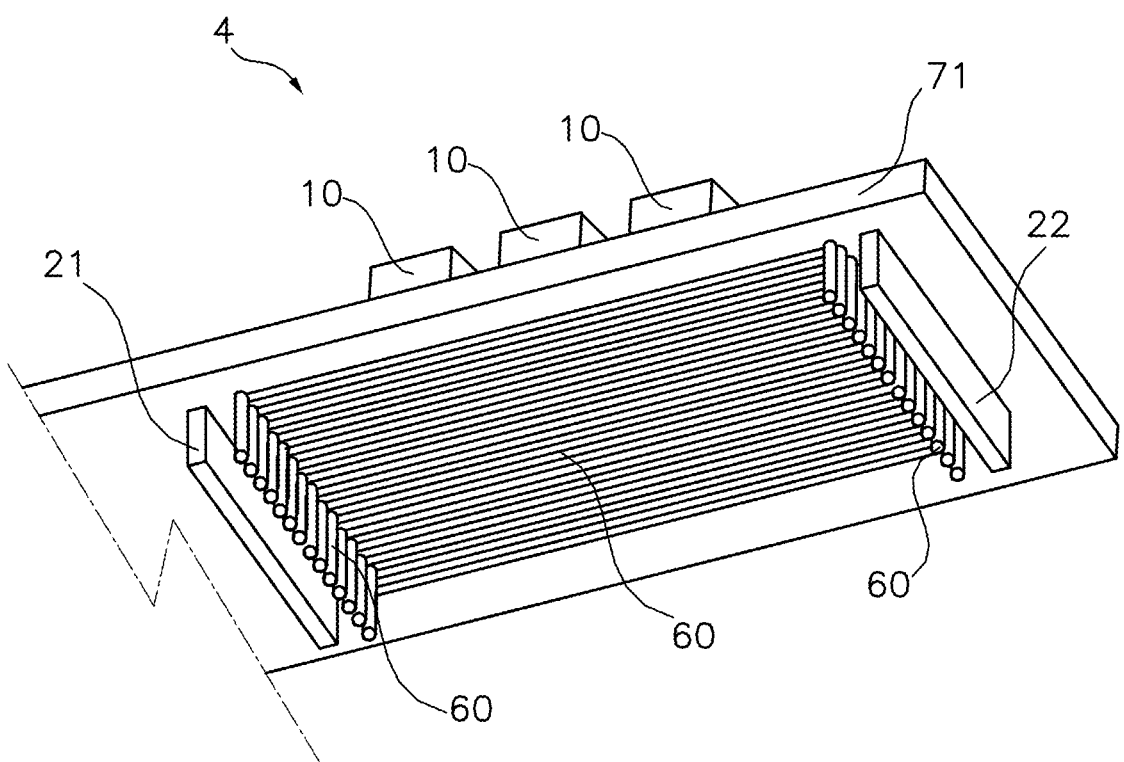

FIGS. 17A and 17B show in perspective a possible constructive structure for an electrical power converter containing one cell (for example a secondary winding and output of the converter) in which the cell is energized by a primary winding with a multiplicity of turns, embraced by the cell. The cell contains a multiplicity of switches and another multiplicity of capacitors.

Figure 17C:
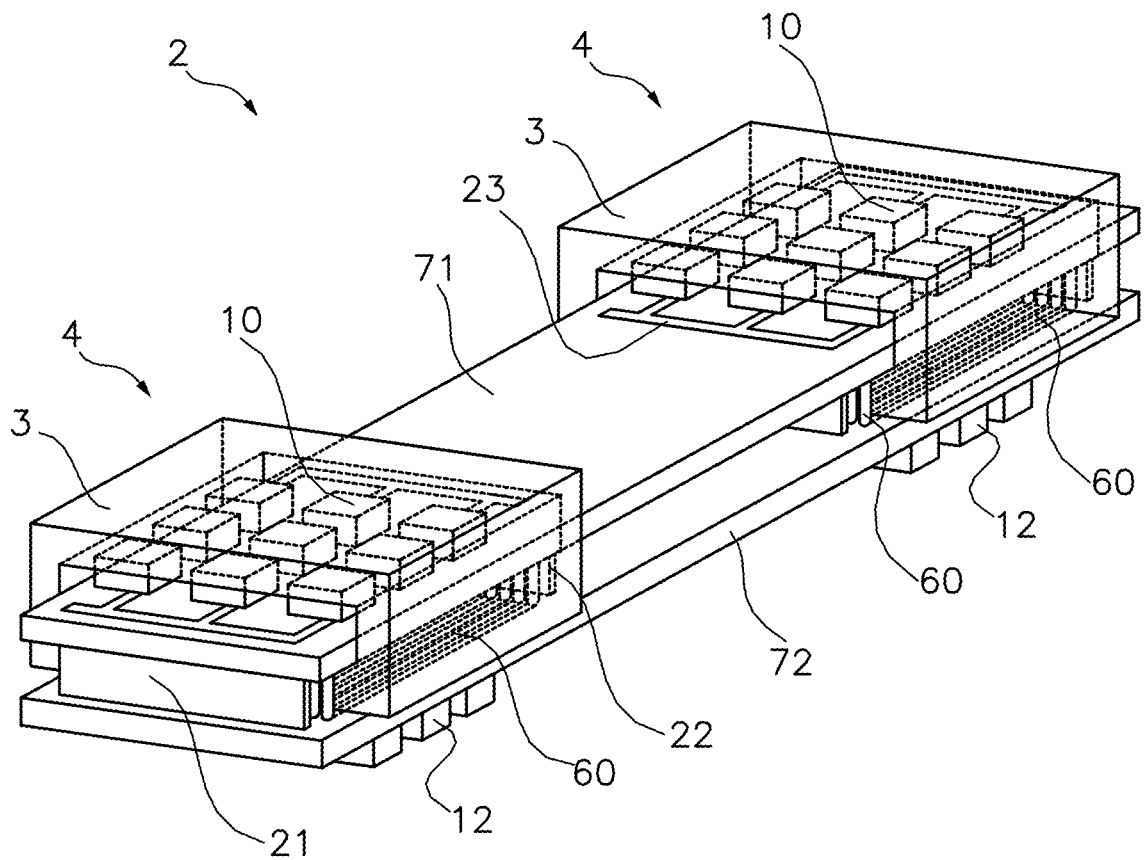

FIG. 17C shows in perspective a possible constructive structure for an electrical power converter including two independent setups as the one described in FIGS. 17A and 17B.

Figure 17D:
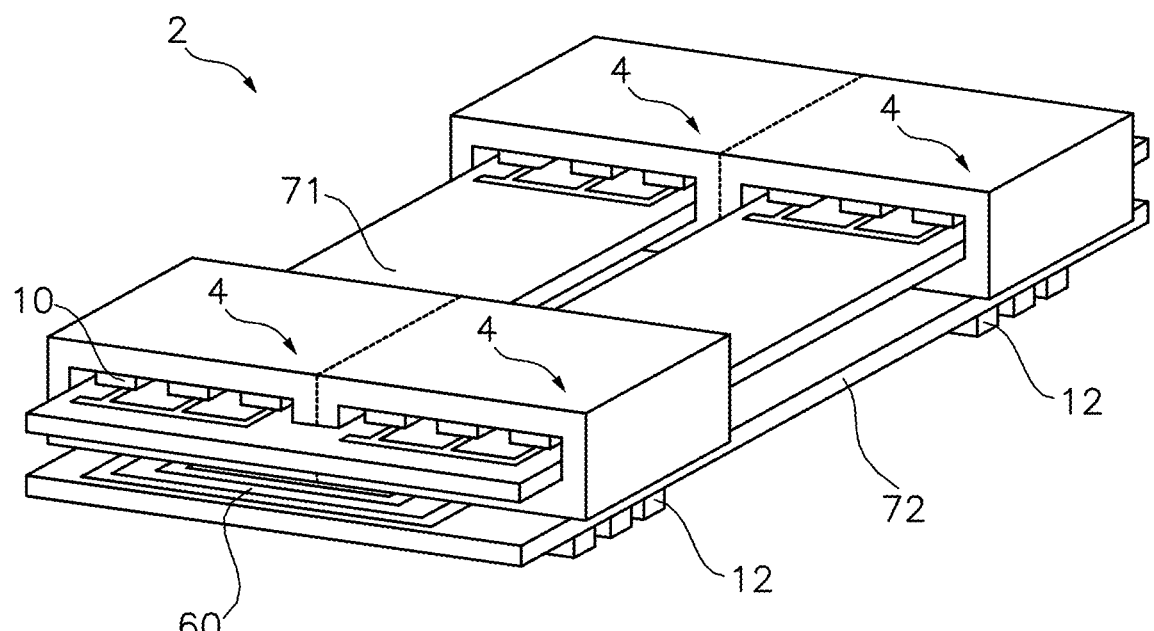

FIG. 17D shows in perspective a possible constructive structure as the one described in FIG. 17C in which the primary winding is shared by the two setups and therefore there is a common primary current that energizes both set-ups simultaneously.

Figure 17E:
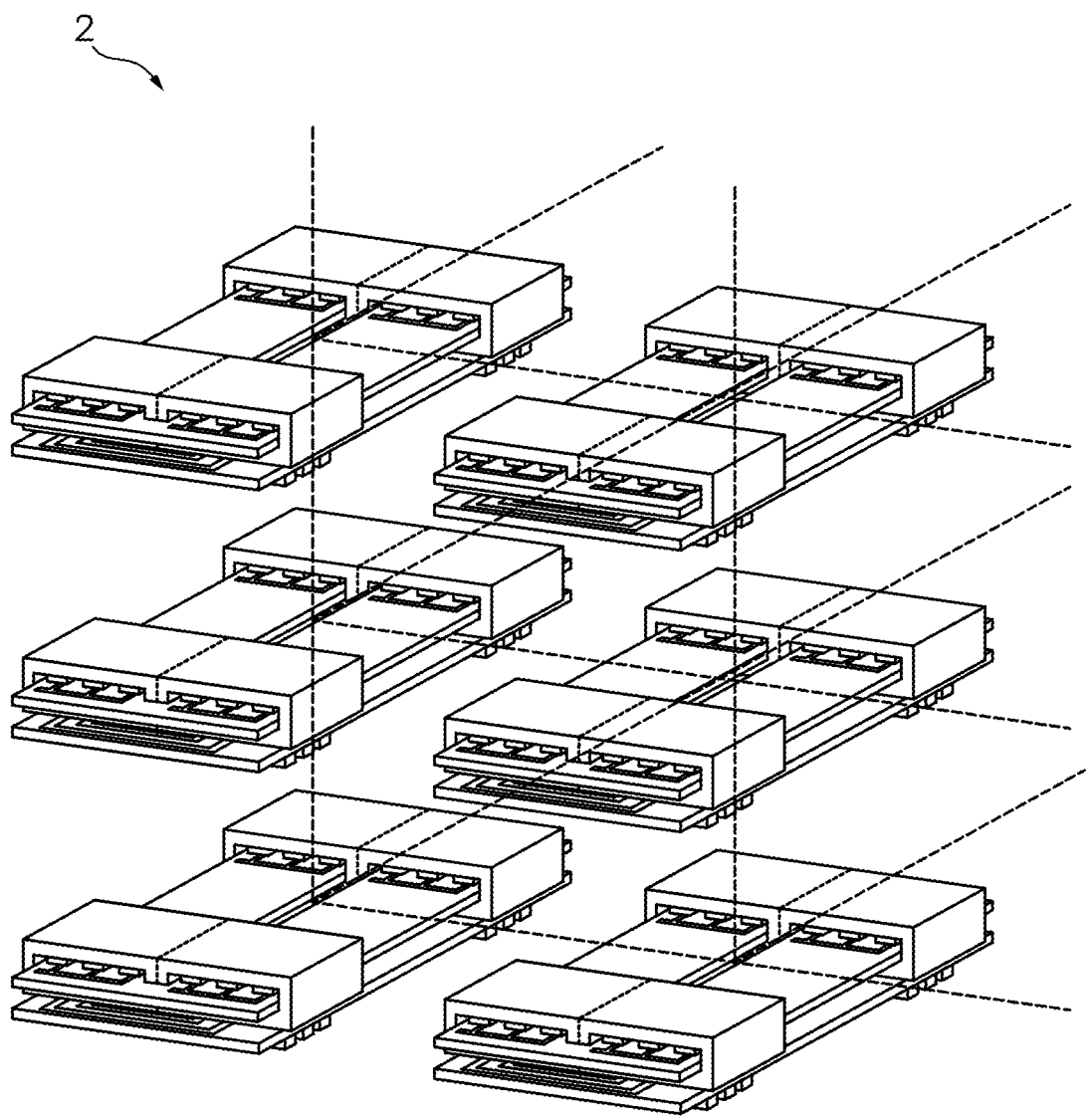

FIG. 17E shows in perspective a multiplicity of setups as described in FIGS. 17A to 17D in which said setups may be arranged in a 2D matrix and even in 3D cubes, with the possibility to share a primary winding and therefore being energized by the same common current.

DETAILED DESCRIPTION OF SEVERAL EMBODIMENTS

Figure 9A:
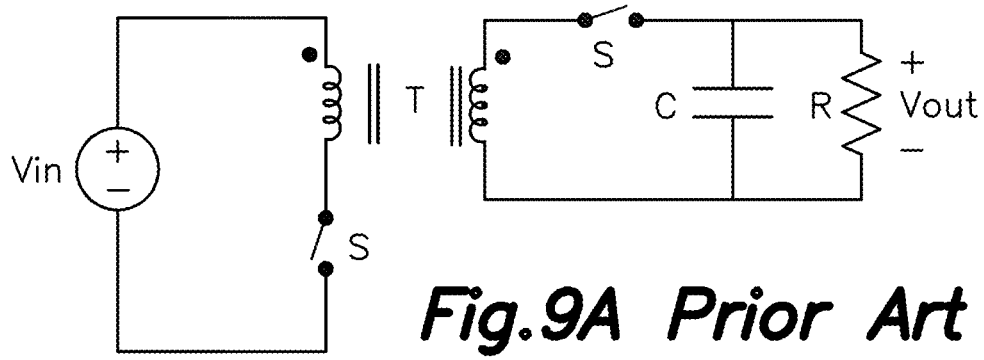
Figure 9B:
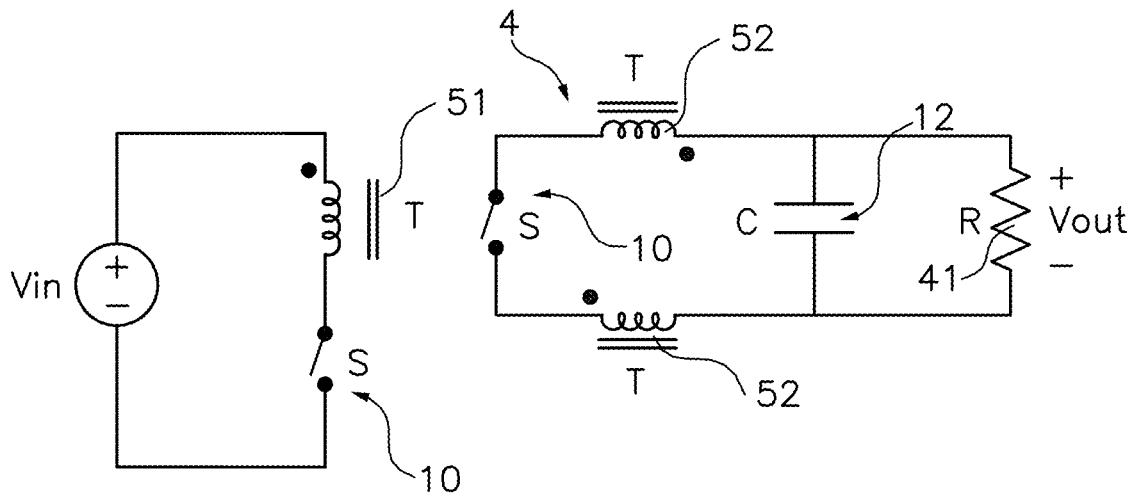
Figure 10:
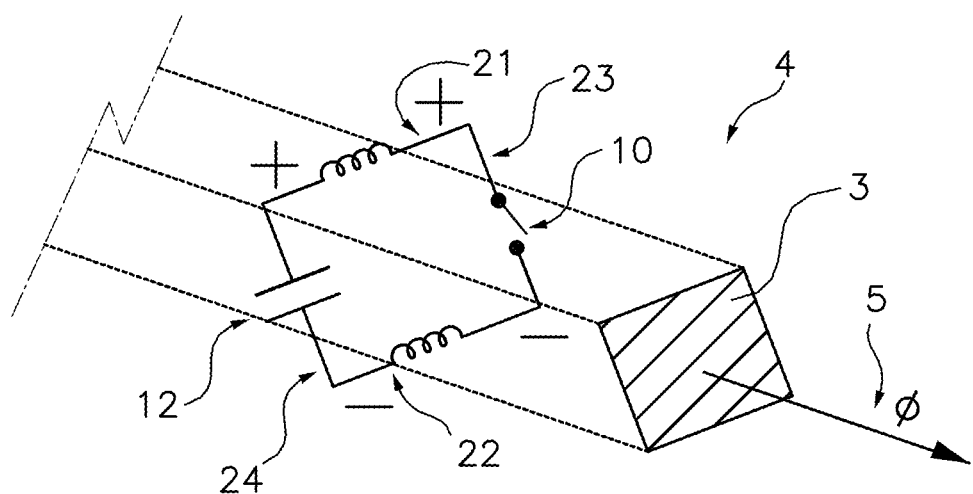
Figure 11:
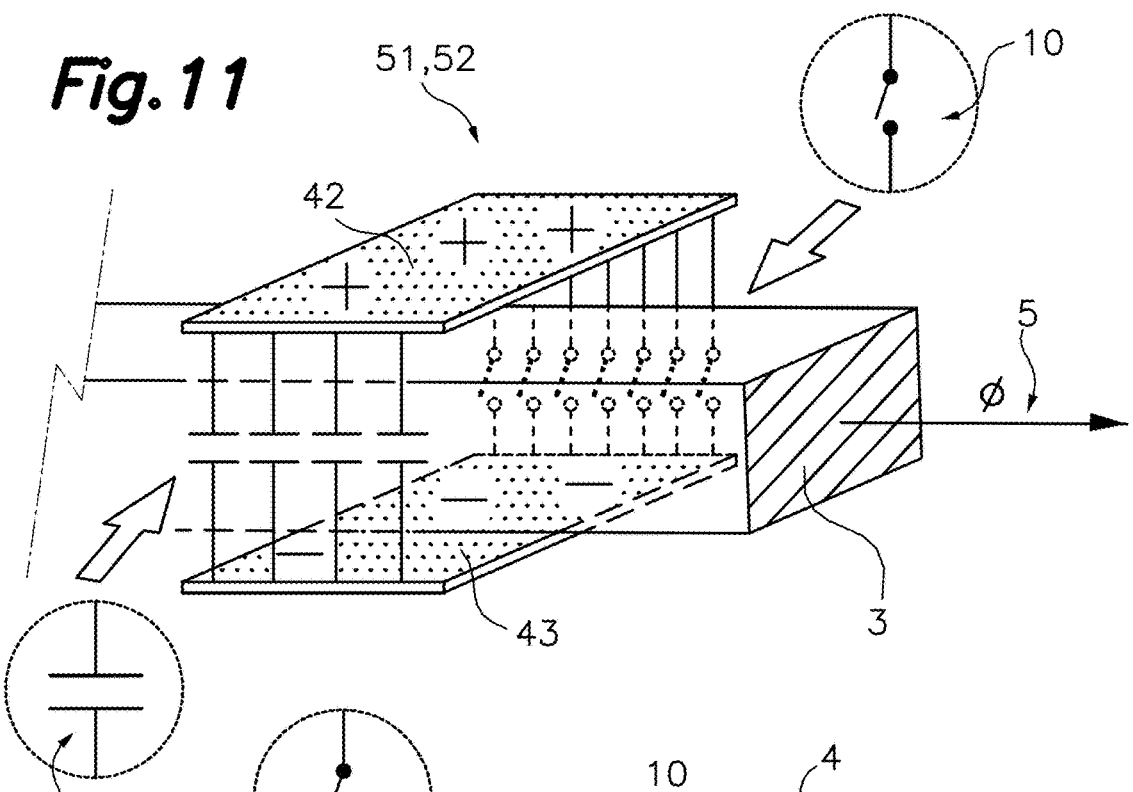
Figure 12:
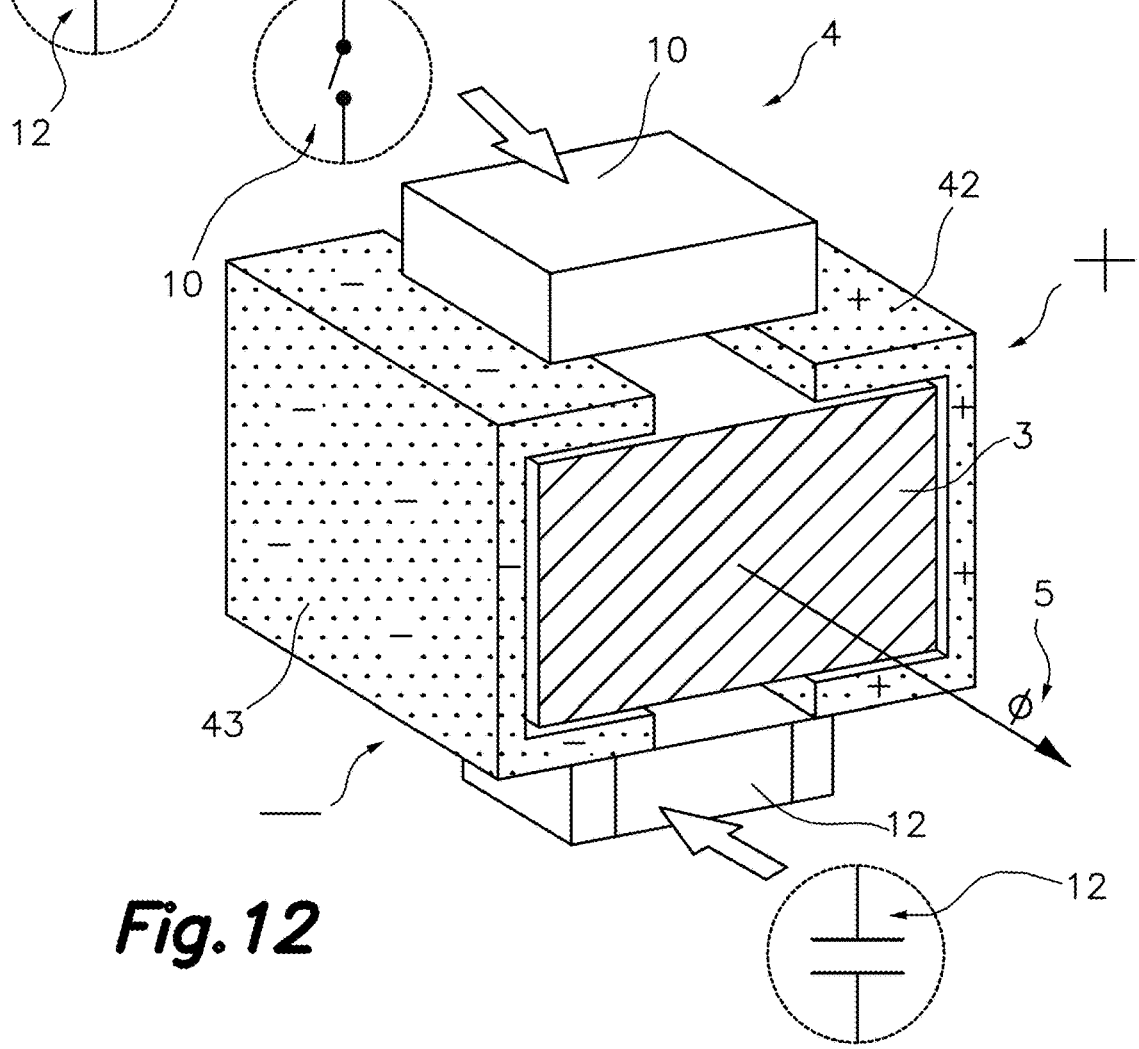
Figure 13:
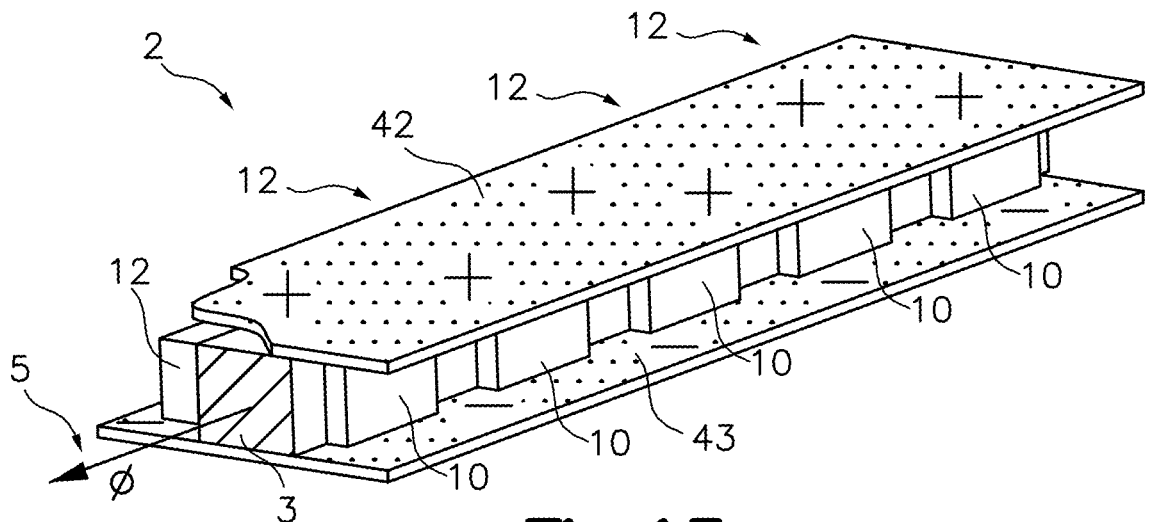
Figure 14:
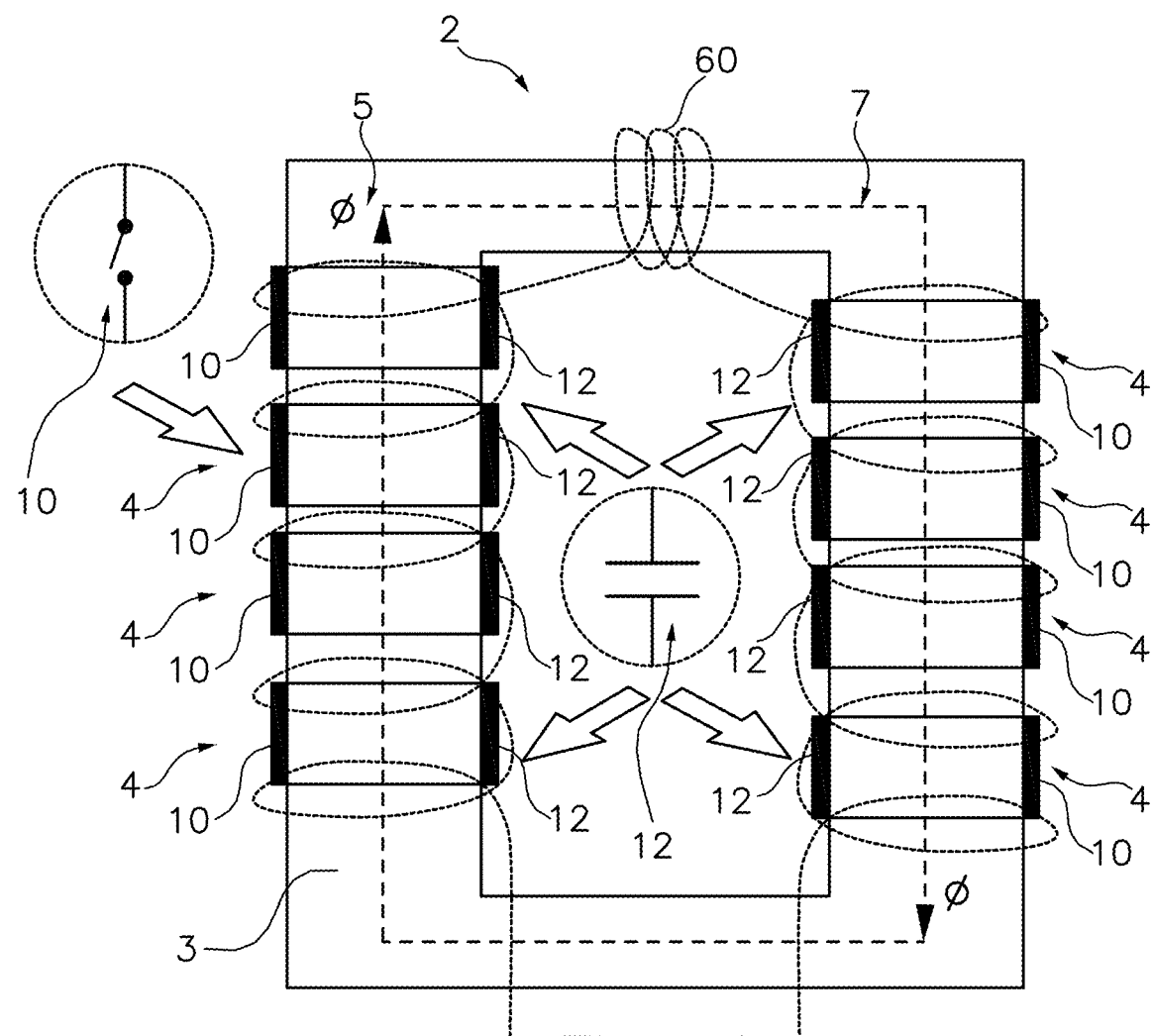
FIG. 14 is another embodiment of one winding of a transformer of an electrical power converter of the invention with several cells around a magnetic core and a winding devoid of switches and capacitors.

The principles of this invention can be better understood with reference to FIGS. 10, 11 and 12, illustrating a primary winding 51 or a secondary winding 52 of an electrical power converter 2 (possible circuit arrangements of such an electrical power converter 2 are shown in FIG. 9B implementing it). One such electrical power converter comprises a transformer or autotransformer including a magnetic core 3 and a primary winding 51 and a secondary windings 52 arranged around the magnetic core 3, both said at least a primary winding 51 and said at least a secondary winding 52 having at least one cell 4, including one full turn. According to this invention the at least one cell 4 of the primary winding 51 and/or the secondary winding 52 includes at least one power switch 10 and at least one capacitor 12 that are arranged respectively opposite each other and facing opposite sides of the magnetic core 3, whereby the cell 4 is divided in four segments: a first segment 23 including said at least one switch 10, a second directly opposite segment 24 including said at least one capacitor 12 and the two other two connecting segments 21, 22 aimed to provide electrical connection between the first segment 23 and the second segment 24 and each of said two other connecting segments 21, 22 having opposite electrical polarity (see in this regard illustration of FIG. 10).

Figure 1:
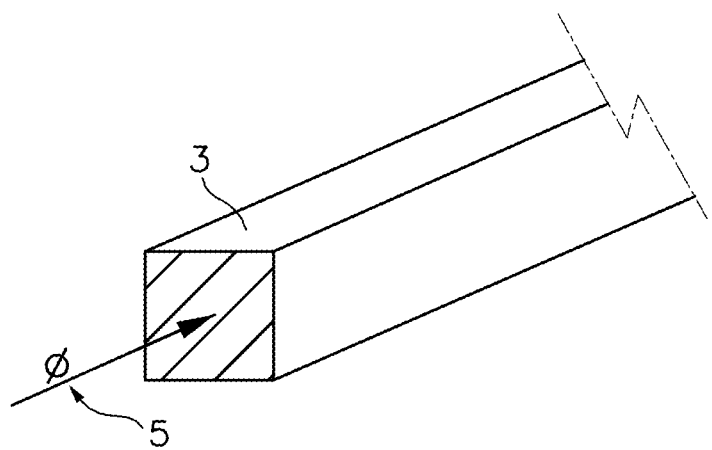
Figure 2:
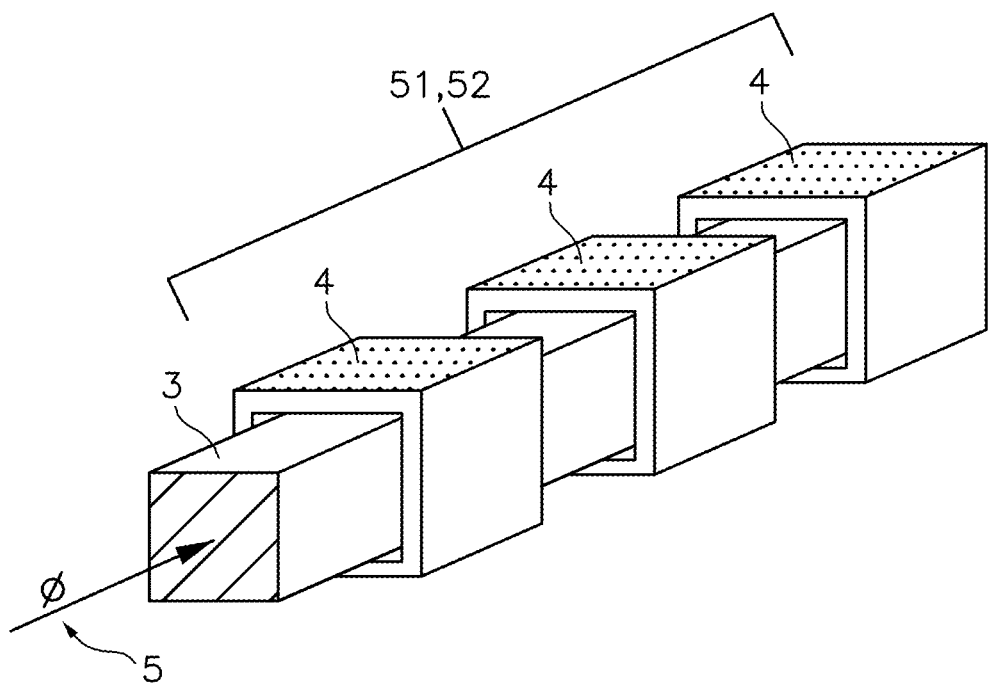

In a general implementation of the invention, the primary 51 and/or secondary 52 windings of the transformer or autotransformer of the electrical power converter 2 comprises several cells 4 (see FIG. 2) each cell 4 including one or several switches 10 and one or more capacitors 12 spatially arranged as indicated and the cells 4 pertaining to a same winding 51, 52 are connected in parallel, whereby the current capability of the electrical power converter 2 is adjustable. The number of switches 10 or capacitors 12 integrated in one cell 4 can be anyone in number and does not have to be equal.

Such an arrangement of the switches 10 and capacitors 12 in opposition at both sides of a magnetic core 3 and facing each other allow to insert a load 41 in between, and adjacent the magnetic core 3, and feed that load 41 from the connecting segments 21, 22 having different electrical polarity.

As FIGS. 17A to 17C show the magnetic core 3 can adopt different configurations so that in the illustrated embodiment the magnetic core 3 surrounds one segment 23 comprising several switches 10.

In an alternative embodiment the magnetic core extends around one segment 24 comprising several capacitors 12.

Still in another embodiment the magnetic core could surround connecting segments 21, 22 providing electrical connection between segments 23 and 24 respectively including switches 10 and capacitors 12 as in the embodiments of FIG. 15A to 15E which will be described below.

Figure 3:
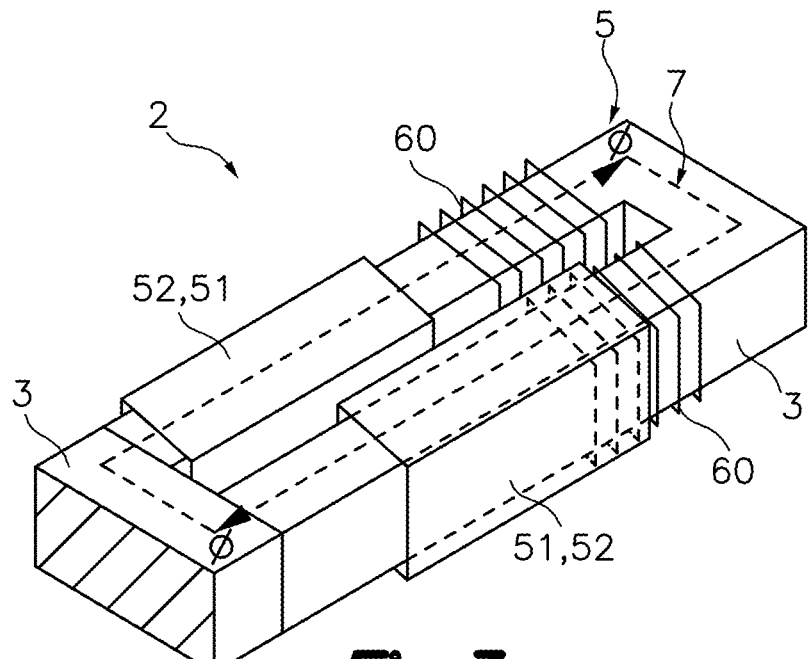

In an embodiment illustrated in FIG. 3 a magnetic core further includes additional windings 60 devoid of power switches 10 and capacitors 12.

Figure 4:
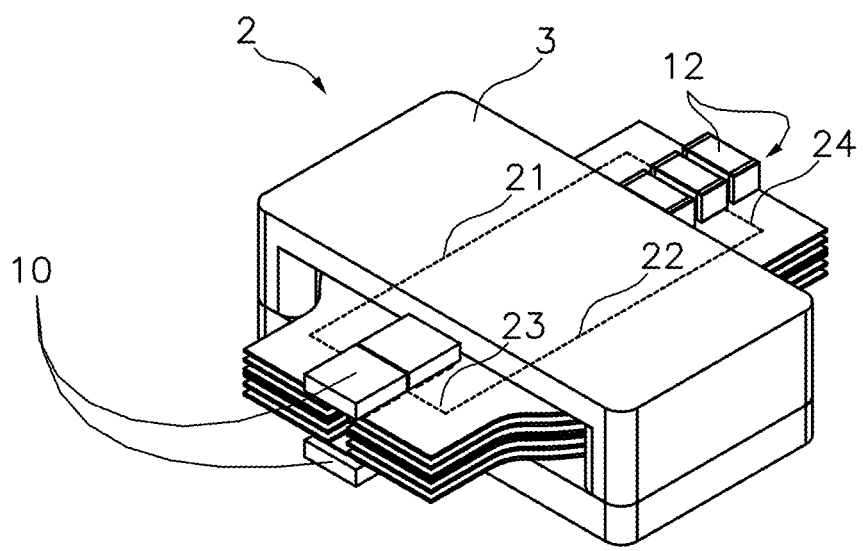

FIG. 4 shows an embodiment of an electrical power converter 2 with segments 23 including switches 10 surrounded by an E-type magnetic core 3 and segments 24 including capacitors 12, arranged in opposition to the switches 10 also surrounded by the E-type magnetic core 3, wherein said segments 23 with switches 10 and segments 24 with capacitors 12 are connected with conductors passing through the space of each window of the magnetic core 3.

Figure 5:
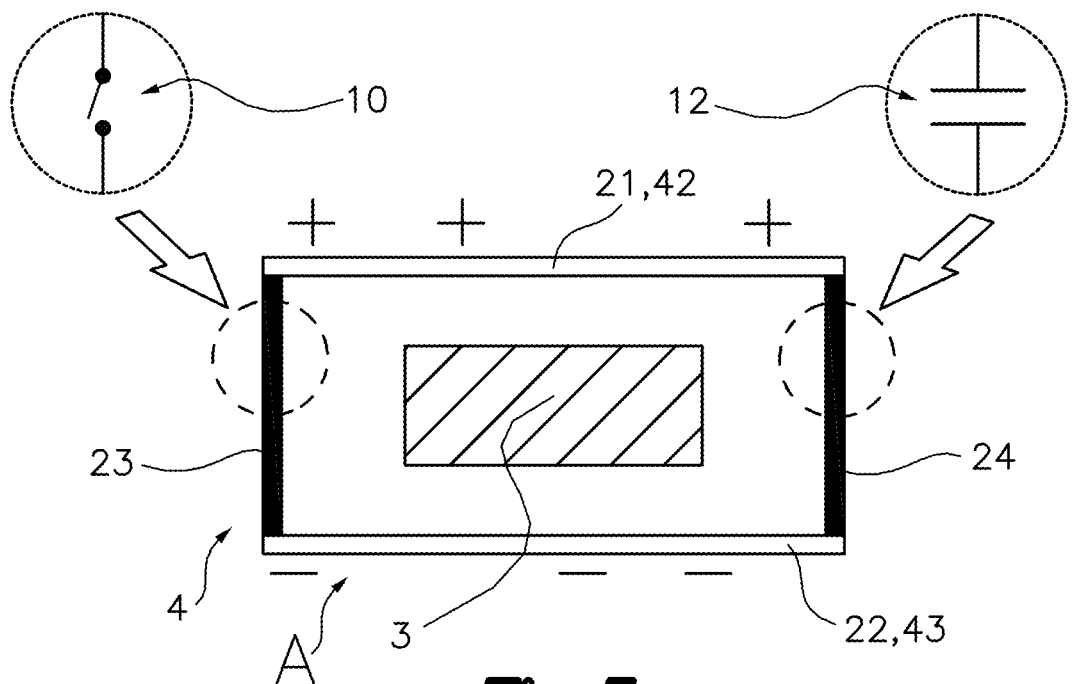

FIG. 5 schematically shows an embodiment of a cell 4, being the cell 4 composed of four segments 21, 22, 23 and 24, including a first lateral segment 23 integrating at least a switch 10, a second lateral segment 24 integrating at least a capacitor 12, with these two segments 23, 24 facing each other and located on opposite sides of the magnetic core 3 and a top segment 21 and a bottom segments 22 constituted by a conductor element providing electrical connection between the first segment 23 and the second segment 24.

Figure 6:
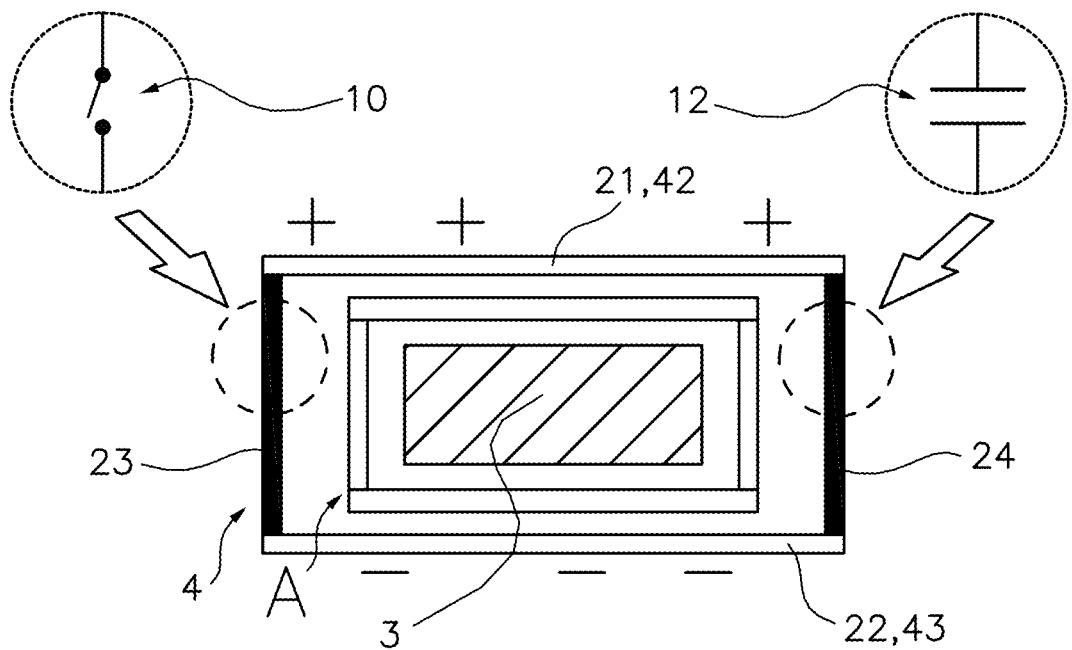

FIG. 6 schematically illustrates a particular spatial arrangement wherein cells 4 pertaining to any of the primary winding 51 or the secondary winding 52 of an electrical power converter 2 embrace cells 4 of another winding, whereby the leakage energy and leakage inductance of the magnetic component are adjustable.

Figure 7:
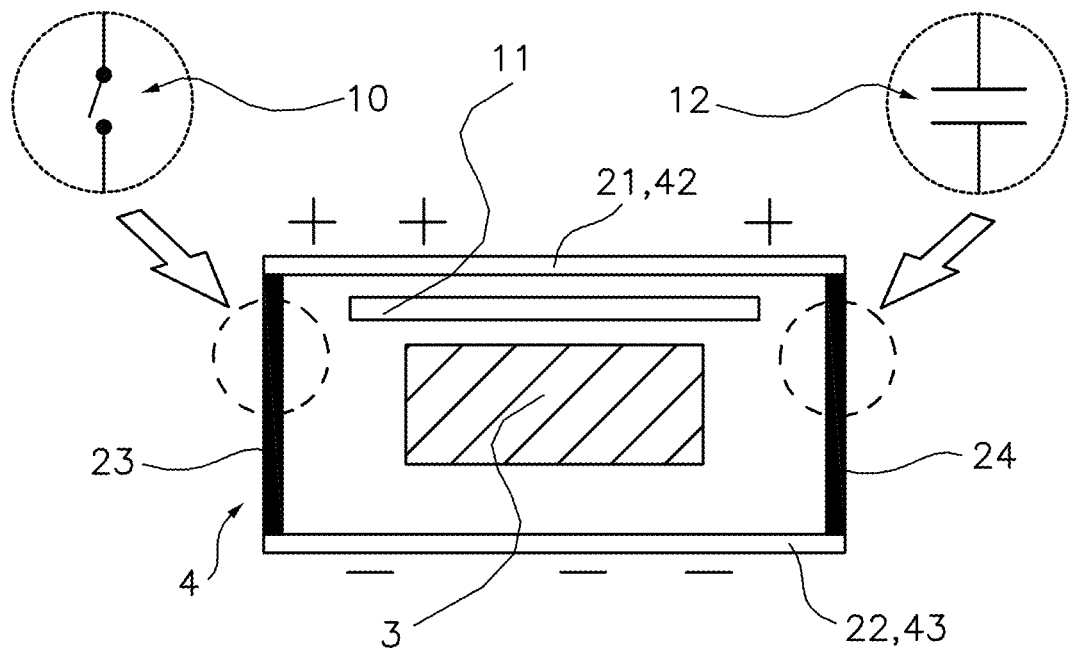

FIG. 7 schematically shows another cell 4 embodiment like the cell embodiment of FIG. 5 further including a conductor element 11 that enables electrical connection between adjacent cells 4 (see FIG. 8), this cell 4 embodiment embracing the conductor element 11 and the magnetic path of the magnetic core 3.

Figure 8:
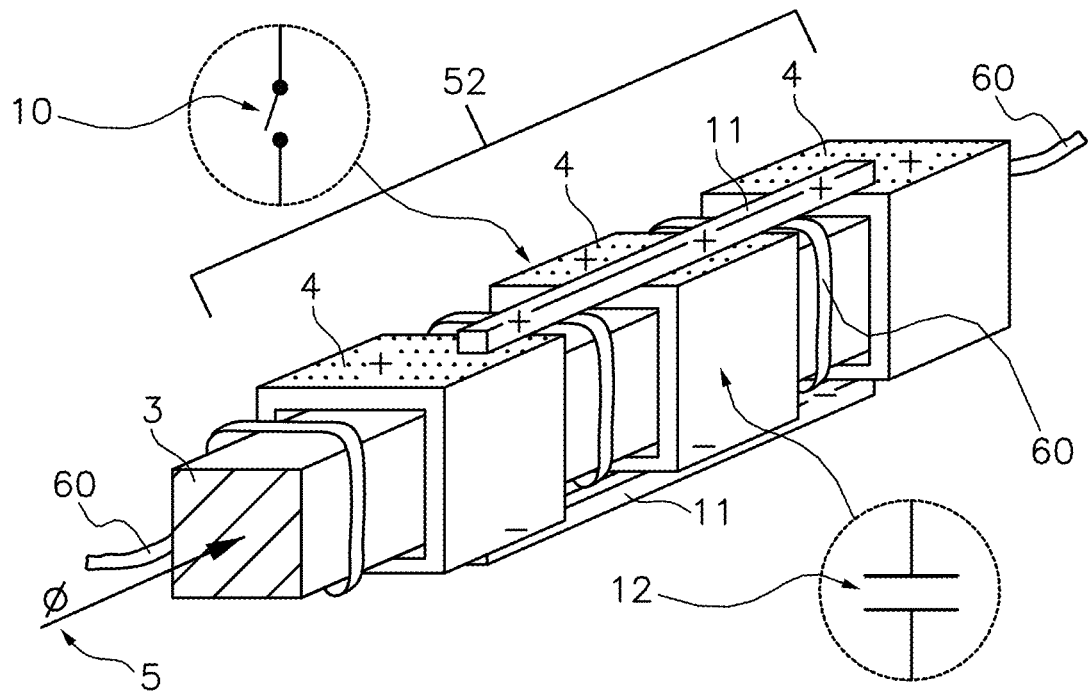

FIG. 8 schematically shows a magnetic core 3 which is surrounded by a winding 60 (in the form of a coil) of the primary and several cells 4 connected in parallel and forming the secondary part 52 of the transformer or autotransformer of an electrical power converter 2. Cells 4 are electrically connected by means of a conductor element 11 (as indicated in FIG. 7). In this embodiment the turns of different windings 60 and 52 are interleaved whereby the leakage energy and leakage inductance of the magnetic component are adjustable.

Figure 9C:
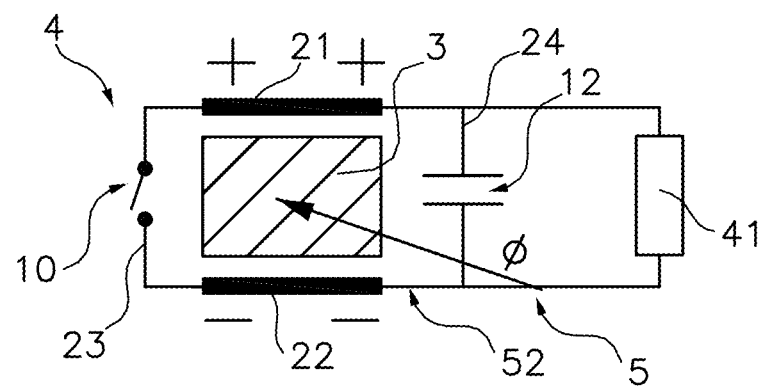
Figure 9D:
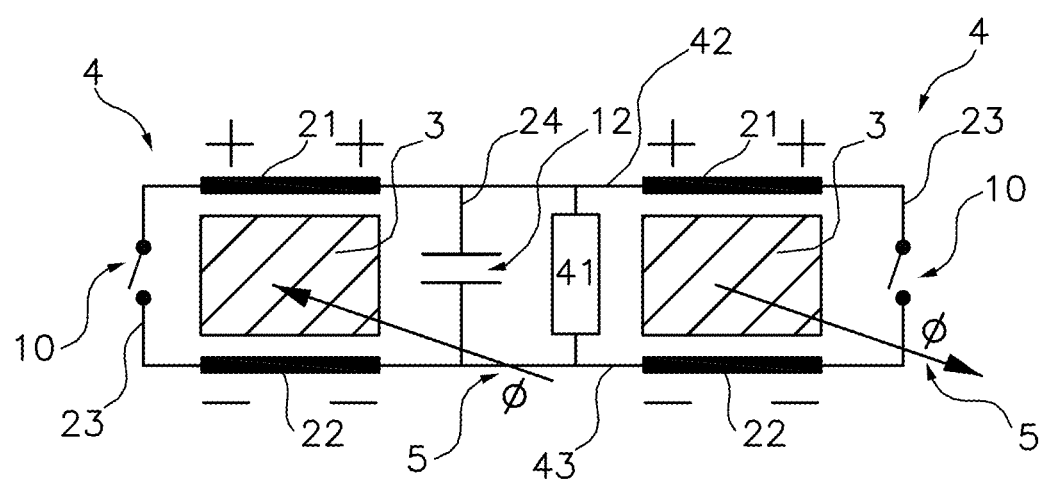
Figure 9E:
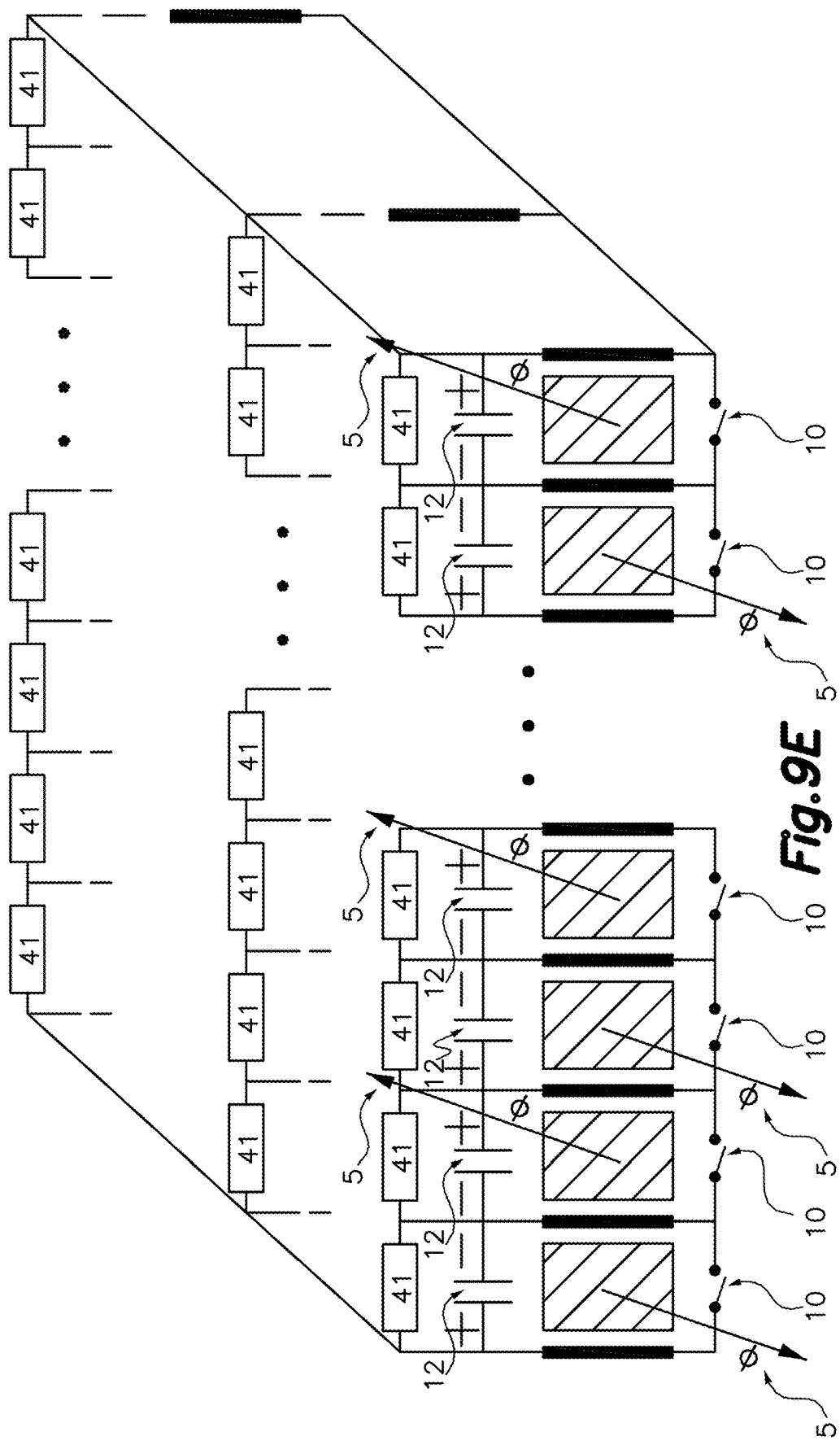

FIG. 9B illustrates an embodiment of this invention that with regard to the previous art (FIG. 9A) the secondary winding 52 of the transformer has been split in two parts and the switch 10 and the capacitor 12 of the circuit are arranged in opposition, providing a cell 4, and a load 41 being fed from the two split windings. In FIG. 9C a magnetic core 3 has been indicated surrounded by the four segments 21, 22, 23 and 24 of the cell 4. A further development of the structure appears in FIG. 9D in which two cells 4 are connected in parallel by two conductive plates 42 and 43.

Figure 15A:
FIGS. 15A to 15E show in perspective and schematically way several parts of an embodiment in which the magnetic core surrounds the conductor elements providing connecting segments that share a central portion.
Figure 15B:
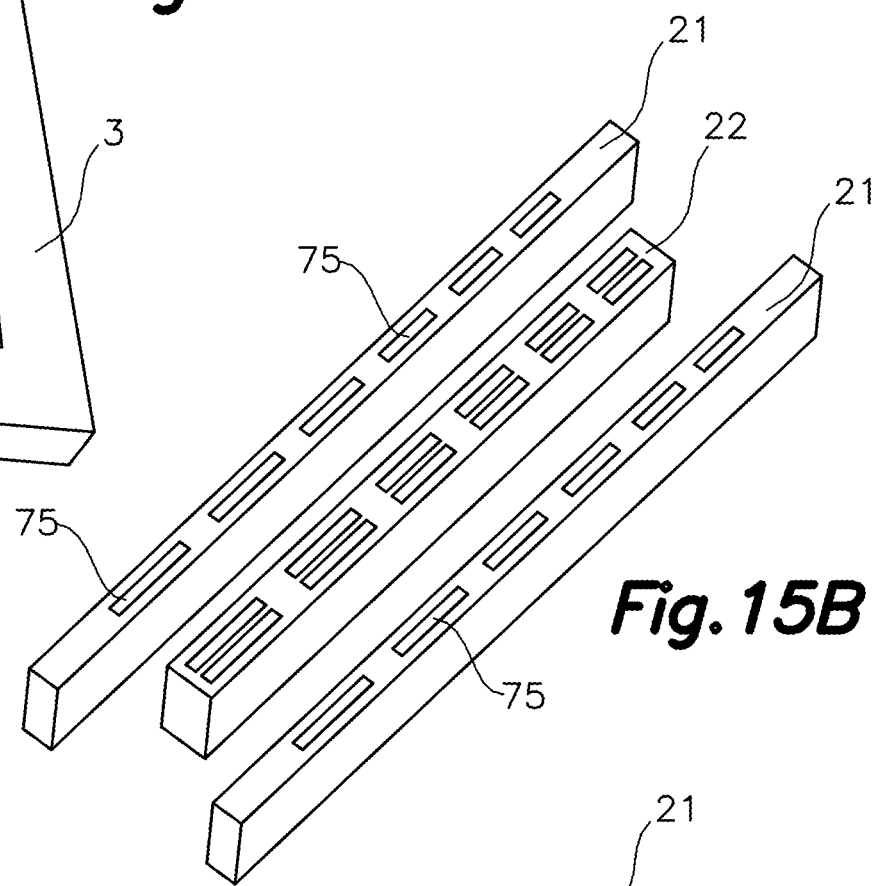
Figure 15C:
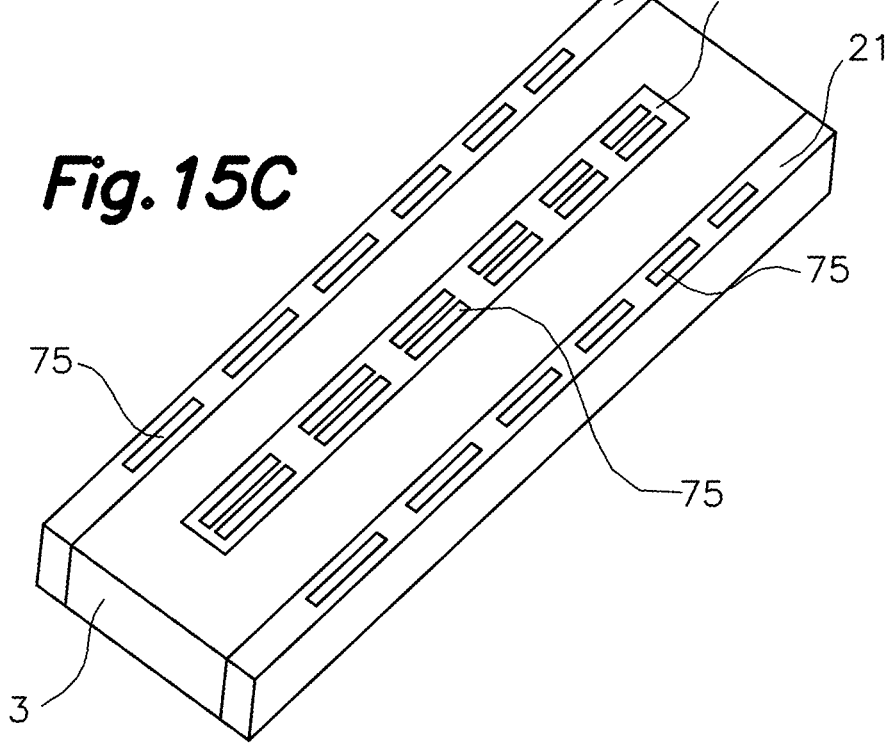
Figure 15D:
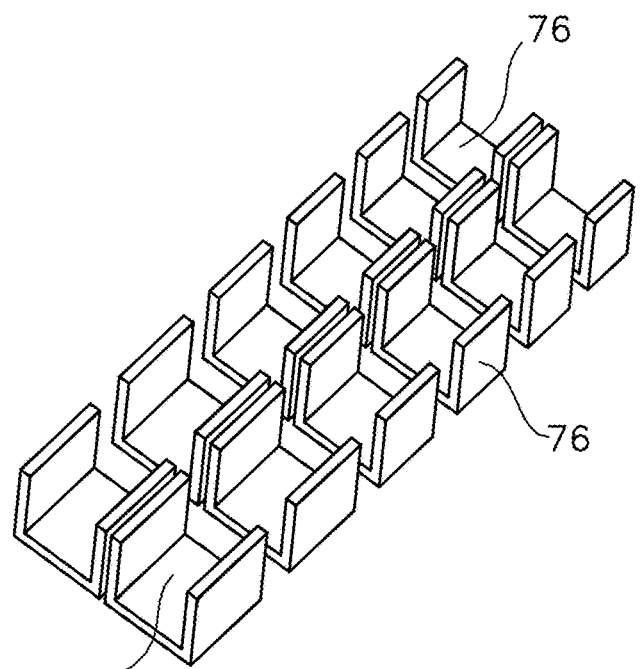
Figure 15E:
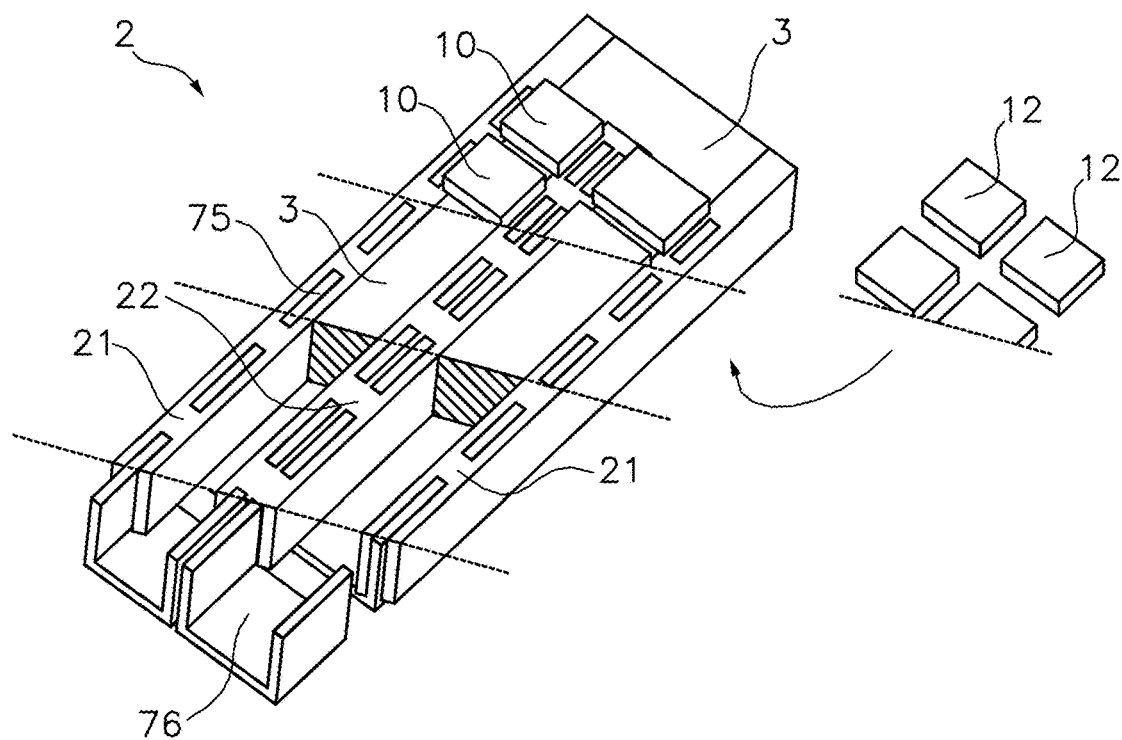

FIGS. 15B and 15C show in perspective different parts of an embodiment in which a magnetic core 3 (see FIG. 15A) is arranged surrounding an inner elongated connecting portion providing two attached connecting segments 22 each of them opposed to a corresponding external connecting segments 21 also made by an elongated connecting portion. Each of the cited elongated portions include through passages 75 through which electrical connection pieces 76 extend so that a winding 51, 52 is formed including according to this invention switches 10 and capacitors 12 in opposition (see FIG. 15E).

FIGS. 16A to 16D show an embodiment in which several interconnected cells 4 embrace different magnetic paths. According to FIG. 16D see the enlarged part, the magnetic core 3 comprises a magnetic core grid 13 with a plurality of apertures 40 some of which include capacitors 12 pertaining to one of said interconnected cells 4, the capacitors 12 being arranged on the sides of the aperture 40 (one or more capacitors 12 can be included). The apertures 40 with capacitors 12 further houses a load 41 (that can be an electronic semiconductor circuit) and the magnetic core grid 13 further includes in other adjacent apertures 40 power switches 10 of said interconnected cells 4, arranged on the sides of other adjacent apertures 40. As FIG. 16D illustrates the load 41 receives energy from conductive plates 42, 43 having opposite electrical polarity, forming a magnetic core grid 13 assembly that is sandwiched between said conductive plates 42, 43. This magnetic core grid 13 assembly is integrated in an electronic board or in a multi-layer electronic stack. In an alternative embodiment the magnetic core grid 13 assembly is integrated in an electronic semiconductor circuit.

FIGS. 17A and 17B show in perspective and schematic view one constructive embodiment in which a plurality of switches 10 of a cell 4 are integrated in a first electronic board 71 and a plurality of capacitors 12 of the same cell 4 are integrated in a second electronic board 72 and wherein the cell 4 of a winding embrace another independent winding 60 (as previously shown in FIG. 6) included in one of the electronic boards 71, 72 or between them.

FIGS. 17C and 17D illustrate in perspective a part of an electrical power converter 2 including a multiplicity of cells 4 of a secondary winding, connected in parallel, that are arranged in a structure where some of the cells 4 or all of them are energized by one primary winding of each, that has been indicated by numerical reference 60.

In an alternative embodiment of FIG. 17D some or the cells 4 or all of them are energized simultaneously by a common current of a single primary winding, indicated by numerical reference 60 that generates a current loop perpendicular or parallel to the induced current in the secondary windings of the cells 4.

FIG. 17E shows another embodiment with a multiplicity of cells 4 of a secondary winding, connected in parallel that are arranged in 3D structure in several relative positions of space.

As in the previous embodiments of FIG. 17D the cells 4 can be energized by one primary winding associated to each of them or be energized simultaneously by a common current of a single primary winding, indicated by numerical reference 60 that generates a current loop perpendicular or parallel to the induced current in the secondary windings of the cells 4.

What is claimed is:

1. An electrical power converter, comprising a transformer or autotransformer including a magnetic core and at least a primary winding and at least a secondary winding arranged around a magnetic core, characterised in that:
   at least one of said primary winding and said secondary winding comprising at least one full turn, at least one power switch and at least one capacitor; said at least one power switch and said at least one capacitor connected in series, oppositely disposed to each other and facing opposite sides of said magnetic core; at least one of said primary winding and said secondary winding defining at least one cell that is divided into four segments,
   said cell comprising a first segment including said at least one power switch, a second segment oppositely disposed to said first segment and comprising said at least one capacitor, a third and a fourth segments configured to provide an electrical connection between the first segment and said second segment, and each of said third and fourth segments comprising an opposite electrical polarity.

2. The electrical power converter of claim 1, wherein said magnetic core surrounds at least one of said first segment, said second segment, said third segment or said fourth segment.

3. The electrical power converter of claim 1, wherein at least one of said primary winding or said secondary winding comprises a plurality of cells, each one of said plurality of cells comprising at least one power switch and at least one capacitor; a first group of the plurality of cells associated with said primary winding connected in parallel to one another, a second group of the plurality of cells associated with said secondary winding connected in parallel to one another.

4. The electrical power converter of claim 3, wherein each of said at least one power switch and said at least one capacitor are connected to one another by means of at least a first conductive plate and a second conductive plate; said first conductive plate and said second conductive plate disposed in at partially surrounding relation to a magnetic core; said first conductive plate and said second conductive plates respectively comprising said third segment and said fourth segment.

5. The electrical power converter of claim 4, further comprising several interconnected ones of said plurality of cells, wherein different ones of the plurality of cells embrace different magnetic paths.

6. The electrical power converter of claim 5, wherein said magnetic core comprises a magnetic core grid with a plurality of apertures; at least some of the plurality of apertures comprising a group of capacitors each one being associated with one of said plurality of cells, each one of said group of capacitors being disposed on sides of individual ones of said plurality of apertures; each one of said plurality of apertures comprising capacitors each one being configured to houses a load; said magnetic core grid further comprising a group of power switches of said plurality of cells with capacitors; each one of said group of power switches being disposed on different, adjacent sides of individual ones of said plurality of apertures.

7. The electrical power converter according to claim 6, wherein said load receives energy from said first conductive plate and said second conductive plate, said first conductive plate and said second conductive plate cooperatively configured to define a magnetic core grid assembly that is disposed between said first conductive plate and said second conductive plates.

8. The electrical power converter according to claim 7, wherein said magnetic core grid assembly is integrated in an electronic board or in a multi-layer electronic stack.

9. The electrical power converter according to claim 7, wherein said magnetic core grid assembly is integrated in an electronic semiconductor circuit.

10. The electrical power converter according to claim 6, wherein the load (41) comprises an electronic semiconductor circuit.

11. The electrical power converter according to claim 1, wherein said magnetic core further comprises at least third winding absent power switches and capacitors.

12. The electrical power converter of claim 11, wherein the turns of different ones of said primary winding, said secondary winding and said third winding are interleaved and are operatively configured such that leakage energy and leakage inductance of the magnetic component are adjustable.

13. The electrical power converter according to claim 1 comprising at least one of a DC/DC power converter, an AC/DC power converter, an AC/AC power converter or an AC/DC power converter.

14. The electrical power converter of claim 1, wherein at least some of a plurality of cells associated with at least said primary winding or said secondary winding embrace cells of a different winding; and are operatively configured such that leakage energy and leakage inductance of the magnetic component are adjustable.

15. The electrical power converter according to claim 1, wherein said first segment is integrated in a first electronic board and said second segment is integrated in a second electronic board said third segment and said fourth segments are at least partially disposed in at least one of said first electronic board or said second electronic bard, or are disposed as an independent piece in either said first electronic board or said second electronic board.

16. The electrical power converter according to claim 1 further comprising a plurality of cells; at least some of said plurality of cells are associated with said secondary winding and are arranged in a 2D or 3D structure in several relative positions of space; at least some of said plurality of cells are energized by said primary winding or are driven and energized simultaneously by a common current of a single primary winding and are configured to generates a current loop perpendicular or parallel to a current induced in said secondary winding.

* * * * *